(12) United States Patent
Seo et al.

(10) Patent No.: US 12,543,541 B2
(45) Date of Patent: Feb. 3, 2026

(54) SEMICONDUCTOR PACKAGE WITH NANOTWIN COPPER BOND PADS

(71) Applicant: Samsung Electronics Co., Ltd., Suwon-si (KR)

(72) Inventors: Ju Bin Seo, Seongnam-si (KR); Su Jeong Park, Hwaseong-si (KR); Seok Ho Kim, Hwaseong-si (KR); Kwang Jin Moon, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 628 days.

(21) Appl. No.: 17/897,729

(22) Filed: Aug. 29, 2022

(65) Prior Publication Data

US 2023/0282528 A1    Sep. 7, 2023

(30) Foreign Application Priority Data

Mar. 2, 2022  (KR) .................. 10-2022-0026706

(51) Int. Cl.
*H01L 23/498* (2006.01)
*H01L 21/66* (2006.01)
*H01L 23/00* (2006.01)

(52) U.S. Cl.
CPC .............. *H01L 22/32* (2013.01); *H01L 24/05* (2013.01); *H01L 24/06* (2013.01); *H01L 24/08* (2013.01);
(Continued)

(58) Field of Classification Search
CPC . H01L 21/185; H01L 21/187; H01L 21/2007; H01L 24/80; H01L 24/89;
(Continued)

(56) References Cited

U.S. PATENT DOCUMENTS 8,492,265 B2    7/2013  Yang et al.
8,647,983 B2    2/2014  Di Cioccio et al.
(Continued)

FOREIGN PATENT DOCUMENTS

JP          2012178547 A       9/2012

OTHER PUBLICATIONS

Notice of Allowance in Korean Appln.n No. 10-2022-0026706, mailed on Sep. 11, 2025, 5 pages (with English translation).

*Primary Examiner* — Wael M Fahmy
*Assistant Examiner* — Aneesa Riaz Baig
(74) *Attorney, Agent, or Firm* — Fish & Richardson P.C.

(57) ABSTRACT

A semiconductor package is provided. The semiconductor package includes a first semiconductor substrate, a first semiconductor element layer on an upper surface of the first semiconductor substrate, a first wiring structure on the first semiconductor element layer, a first connecting pad connected to the first wiring structure, a first test pad connected to the first wiring structure, a first front side bonding pad connected to the first connecting pad and including copper (Cu), and a second front side bonding pad connected to the first front side bonding pad and including copper (Cu) which has a nanotwin crystal structure different from a crystal structure of copper (Cu) included in the first front side bonding pad, wherein a width of the first front side bonding pad in the horizontal direction is different from a width of the second front side bonding pad in the horizontal direction.

20 Claims, 13 Drawing Sheets

(52) U.S. Cl.
CPC .... *H01L 24/80* (2013.01); *H01L 2224/05147* (2013.01); *H01L 2224/05647* (2013.01); *H01L 2224/06515* (2013.01); *H01L 2224/08145* (2013.01); *H01L 2224/80379* (2013.01); *H01L 2924/05042* (2013.01)

(58) Field of Classification Search
CPC ......... H01L 24/08; H01L 24/09; H01L 24/73; H01L 2224/08145–08148; H01L 2224/80895; H01L 2224/80896; H01L 24/03–09; H01L 25/50; H01L 25/0657; H01L 25/074; H01L 25/117; H01L 25/18; H01L 2224/06515; H01L 2224/80894
See application file for complete search history.

(56) References Cited

U.S. PATENT DOCUMENTS

| | | | | |
|---|---|---|---|---|
| 9,461,007 | B2 | 10/2016 | Chun et al. | |
| 9,620,479 | B1 | 4/2017 | Edelstein et al. | |
| 9,842,816 | B2* | 12/2017 | Chen | H01L 21/31144 |
| 10,867,943 | B2* | 12/2020 | Chen | H01L 24/08 |
| 11,011,494 | B2* | 5/2021 | Gao | H01L 24/83 |
| 11,145,619 | B2 | 10/2021 | Chen et al. | |
| 11,658,141 | B2* | 5/2023 | Hong | H01L 24/06 257/621 |
| 2020/0161263 | A1* | 5/2020 | Chen | H01L 24/06 |
| 2020/0335408 | A1* | 10/2020 | Gao | H01L 24/03 |
| 2021/0020599 | A1* | 1/2021 | Chen | H01L 24/83 |
| 2021/0066222 | A1* | 3/2021 | Chen | H01L 21/76879 |
| 2021/0175192 | A1* | 6/2021 | Mueller | H01L 24/03 |
| 2021/0225801 | A1 | 7/2021 | Uzoh | |
| 2022/0285303 | A1* | 9/2022 | Mirkarimi | H01L 24/08 |
| 2023/0038603 | A1* | 2/2023 | Choi | H01L 22/32 |
| 2023/0048311 | A1* | 2/2023 | Bhushan | H01L 24/05 |
| 2023/0060208 | A1* | 3/2023 | Chang | H01L 22/32 |
| 2023/0163089 | A1* | 5/2023 | Kim | H01L 25/0652 257/690 |
| 2023/0207530 | A1* | 6/2023 | Chen | H01L 25/50 257/770 |
| 2023/0402413 | A1* | 12/2023 | Lo | H01L 24/08 |
| 2024/0021559 | A1* | 1/2024 | Zhan | H01L 24/08 |

\* cited by examiner

SEMICONDUCTOR PACKAGE WITH NANOTWIN COPPER BOND PADS

CROSS-REFERENCE TO RELATED APPLICATION

This application claims priority from Korean Patent Application No. 10-2022-0026706 filed on Mar. 2, 2022 in the Korean Intellectual Property Office and all the benefits accruing therefrom under 35 U.S.C. 119, the contents of which in its entirety are herein incorporated by reference.

BACKGROUND

1. Technical Field

The present disclosure relates to a semiconductor package.

2. Description of the Related Art

In response to dramatic development of the electronic industry and the demands of users, electronic devices have become smaller, lighter, and have had multi-functionality, and semiconductor packages used in the electrical devices have also been required to become smaller, lighter, and have multi-functionality. To this end, by incorporating two or more types of semiconductor chips into a single semiconductor package, high capacity and multi-functionality of the semiconductor package have been enabled, while significantly reducing the size of the semiconductor package.

On the other hand, in order to achieve the high capacity of the semiconductor package, semiconductor chips may be stacked, using a CoW (Chip on Wafer) type and/or a D2 W (Die to Wafer) type. The CoW type may refer to a type in which a semiconductor chip is stacked on a wafer (or a semiconductor chip), using a connecting member such as a bump or solder. On the other hand, the D2 W type may refer to a type in which a semiconductor chip is stacked on a wafer (or a semiconductor chip) through pad-to-pad bonding or bonding using an ACF (Anisotropic Conductive Film).

SUMMARY

Aspects of the present disclosure provide a semiconductor package having improved thermal characteristics.

According to some embodiments of the present disclosure, there is provided a semiconductor package, comprising a first semiconductor substrate; a first semiconductor element layer above an upper surface of the first semiconductor substrate; a first wiring structure above the first semiconductor element layer; a first connecting pad above and connected to the first wiring structure; a first test pad above and connected to the first wiring structure, the first test pad spaced apart from the first connecting pad in a horizontal direction; a first front side bonding pad above and connected to the first connecting pad, the first front side bonding pad including copper (Cu); and a second front side bonding pad above and connected to the first front side bonding pad, the second front side bonding pad including copper (Cu) which has a nanotwin crystal structure different from a crystal structure of the copper (Cu) included in the first front side bonding pad, wherein a width of the first front side bonding pad in the horizontal direction is different from a width of the second front side bonding pad in the horizontal direction.

According to some embodiments of the present disclosure, there is provided a semiconductor package, comprising a first semiconductor chip including a first semiconductor substrate; a first semiconductor element layer above an upper surface of the first semiconductor substrate, a first wiring structure above the first semiconductor element layer, a first connecting pad above and connected to the first wiring structure, a first front side bonding pad above and connected to the first connecting pad, and a second front side bonding pad above and connected to the first front side bonding pad; and a second semiconductor chip bonded to the first semiconductor chip, the second semiconductor chip including a second semiconductor substrate above the second front side bonding pad, a second semiconductor element layer above an upper surface of the second semiconductor substrate, a second wiring structure above the second semiconductor element layer, a second connecting pad above and connected to the second wiring structure, a third front side bonding pad above and connected to the second connecting pad, and a fourth front side bonding pad above and connected to the third front side bonding pad, wherein the first and third front side bonding pads includes copper (Cu), wherein the second and fourth front side bonding pads includes a copper (Cu) having a nanotwin crystal structure different from a crystal structure of the copper (Cu) included in the first and third front side bonding pads, and wherein a width of the first front side bonding pad in a horizontal direction is larger than a width of the second front side bonding pad in the horizontal direction.

According to some embodiments of the present disclosure, there is provided a semiconductor package, comprising a buffer substrate; a first liner layer, an interlayer insulating layer, and a second liner layer sequentially stacked on an upper surface of the buffer substrate; a first front side bonding pad above the buffer substrate, at least a part of a side wall of the first front side bonding pad surrounded by the second liner layer, the first front side bonding pad including copper (Cu); a second front side bonding pad between and connected to the first front side bonding pad and the buffer substrate, a side wall of the second front side bonding pad surrounded by the first liner layer and the interlayer insulating layer, the second front side bonding pad including copper (Cu) having a nanotwin crystal structure different from a crystal structure of the copper (Cu) included in the first front side bonding pad; a connecting pad above and connected to the first front side bonding pad; wiring structure above and connected to the connecting pad; a semiconductor element layer above the wiring structure; and a semiconductor substrate above the semiconductor element layer, wherein a width of the first front side bonding pad in a horizontal direction is larger than a width of the second front side bonding pad in the horizontal direction.

However, aspects of the present disclosure are not restricted to the one set forth herein. The above and other aspects of the present disclosure will become more apparent to one of ordinary skill in the art to which the present disclosure pertains by referencing the detailed description of the present disclosure given below.

BRIEF DESCRIPTION OF THE DRAWINGS

The above and other aspects and features of the present disclosure will become more apparent by describing in detail example embodiments thereof referring to the attached drawings, in which.

DETAILED DESCRIPTION OF THE EMBODIMENTS

Figure 1:
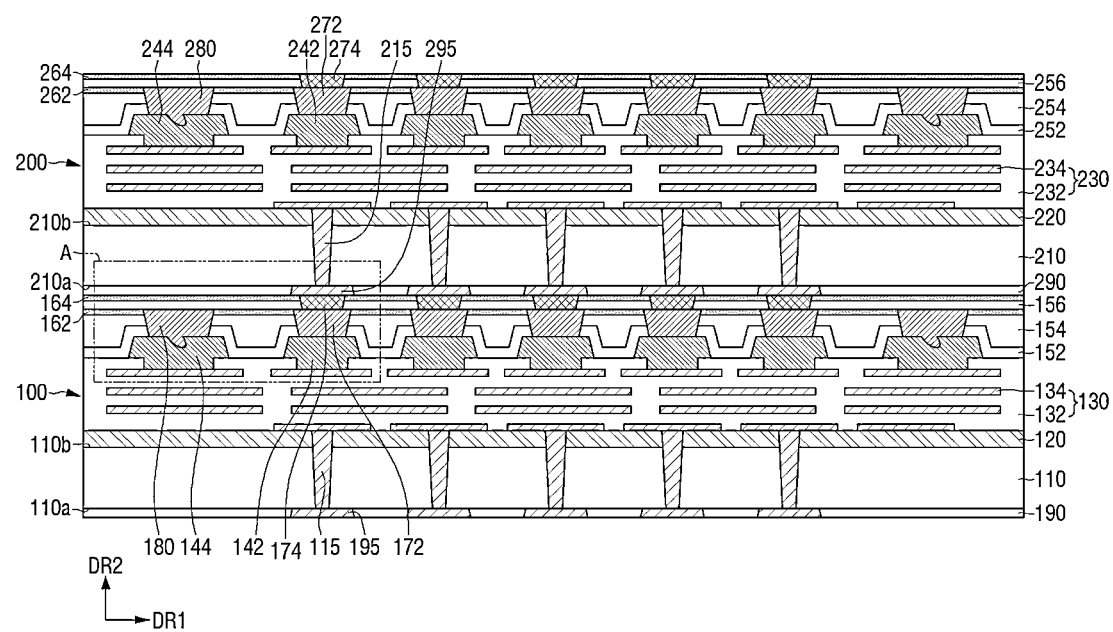
FIG. 1 is a schematic cross-sectional view for explaining a semiconductor package according to some embodiments of this disclosure.

One or more example embodiments will be described in detail with reference to the accompanying drawings. Example embodiments, however, may be embodied in various different forms, and should not be construed as being limited to only the illustrated embodiments. Rather, the illustrated embodiments are provided as examples so that this disclosure will be thorough and complete, and will fully convey the concepts of this disclosure to those skilled in the art. Accordingly, known processes, elements, and techniques, may not be described with respect to some example embodiments. Unless otherwise noted, like reference characters denote like elements throughout the attached drawings and written description, and thus descriptions will not be repeated.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "above," "upper," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "above" other elements or features would then be oriented "below" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

Hereinafter, a semiconductor package according to some embodiments of the present disclosure will be described referring to FIGS. 1 and 2.

FIG. 1 is a schematic cross-sectional view for explaining the semiconductor package according to some embodiments of this disclosure. FIG. 2 is an enlarged view of a region A of FIG. 1.

Figure 2:
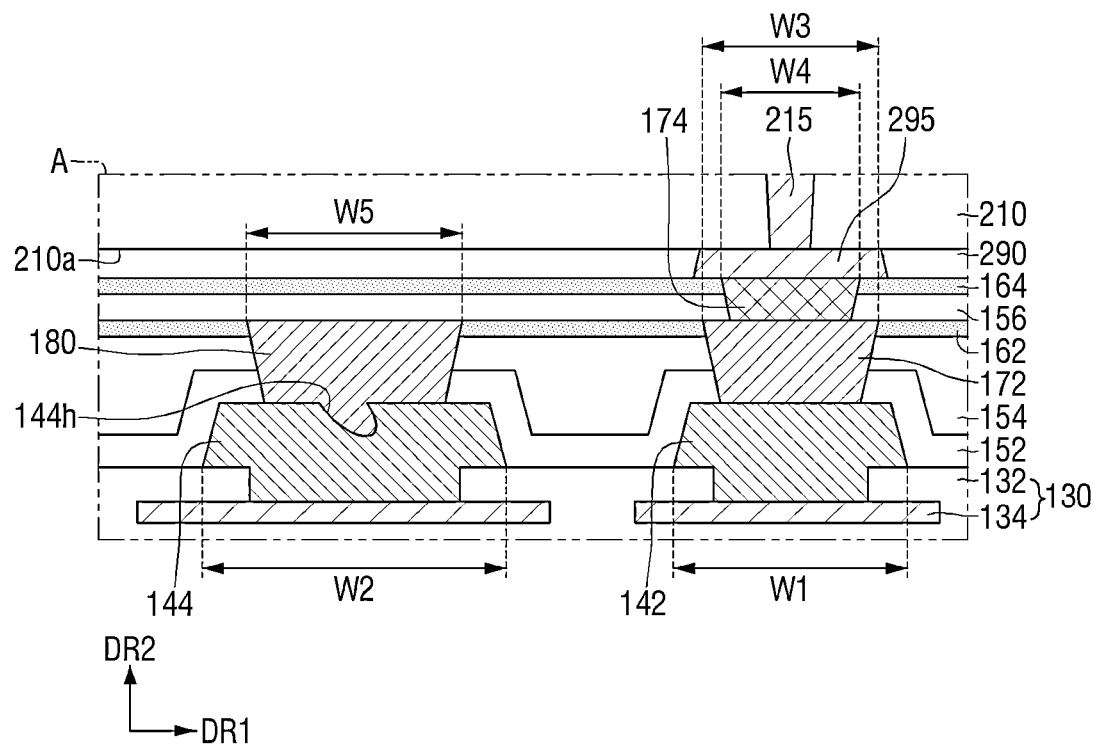
FIG. 2 is an enlarged view of a region A of FIG. 1.

Referring to FIGS. 1 and 2, a semiconductor package according to some embodiments of the present disclosure includes a first semiconductor chip 100 and a second semiconductor chip 200.

Each of the first semiconductor chip 100 and the second semiconductor chip 200 may be an integrated circuit (IC) in which a plurality of semiconductor elements is integrated in a single chip. For example, each of the first semiconductor chip 100 and the second semiconductor chip 200 may be (and/or include) an application processor (AP) (such as a CPU (Central Processing Unit), a GPU (Graphic Processing Unit), an FPGA (Field-Programmable Gate Array), a digital signal processor, an encryption processor, a micro-processor, a micro-controller, and an ASIC (Application-Specific IC)), a volatile memory (such as a dynamic random access memory (DRAM) or a static random access memory (SRAM)), and/or a non-volatile memory (such as a flash memory, a phase-change random access memory (PRAM), a magnetoresistive random access memory (MRAM), a ferroelectric random access memory (FERAM), and/or a resistive random access memory (RAS)). For example, in some embodiments, one of the first or second semiconductor chips 100 and 200 may be the AP and the other may be the memory.

In some embodiments, the first semiconductor chip 100 and the second semiconductor chip 200 may form a multi-chip semiconductor package such as a high bandwidth memory (HBM).

The first semiconductor chip 100 may include a first semiconductor substrate 110, a first through via 115, a first semiconductor element layer 120, a first wiring structure 130, a first connecting pad 142, a first test pad 144, a first passivation layer 152, a first interlayer insulating layer 154, a first liner layer 162, a second interlayer insulating layer 156, a second liner layer 164, a first front side bonding pad 172, a second front side bonding pad 174, a first dummy pad 180, a first back insulating layer 190, and a first back side bonding pad 195.

The first semiconductor substrate 110 may be (and/or include) a semiconductor material. The semiconductor material may be an elemental and/or a compound semiconductor. The first semiconductor substrate 110 may be, for example, bulk silicon and/or silicon on insulator (SOI), and/or the first semiconductor substrate 110 may be a silicon substrate and/or may include, but is not limited to, other materials, for example, silicon germanium, SGOI (silicon germanium on insulator), indium antimonide, lead tellurium compounds, indium arsenic, indium phosphorus, gallium arsenic, gallium antimonide, and/or the like.

The first semiconductor substrate 110 may include a first surface 110a and a second surface 110b that are opposite to each other. The second surface 110b of the first semiconductor substrate 110 may be an active surface on which a first semiconductor element layer 120 to be described below is formed. Hereinafter, the second surface 110b of the first semiconductor substrate 110 may be referred to as a front side of the first semiconductor substrate 110, and the first surface 110a of the first semiconductor substrate 110 may be referred to as a back side of the first semiconductor substrate 110.

The first semiconductor element layer 120 may be disposed on the second surface 110b of the first semiconductor substrate 110. The first semiconductor element layer 120 may include various microelectronic elements, for example, a MOSFET (metal-oxide-semiconductor field effect transistor) such as a CMOS transistor (complementary metal-insulator-semiconductor transistors), a system LSI (large scale integration), a flash memory, a DRAM, a SRAM, an EEPROM, a PRAM, a MRAM or a RERAM, or an image sensor such as a CIS (CMOS imaging sensor), a MEMS (micro-electro-mechanical system), an active element, a passive element and/or the like.

The first wiring structure 130 may on and/or cover the first semiconductor element layer 120. The first wiring structure 130 may be electrically connected to the first semiconductor element layer 120. For example, the first wiring structure 130 may include a first inter-wiring insulating layer 132 that covers the first semiconductor element layer 120, and a first wiring pattern 134 inside the first inter-wiring insulating layer 132. The first wiring pattern 134 may be formed of a multilayer structure and may be electrically connected to the first semiconductor element layer 120. The arrangement, the number of layers, the number, and the like of the first wiring patterns 134 are merely examples and the embodiments are not limited to those shown.

The first wiring pattern 134 may include, for example, a conductive layer, and a barrier layer disposed between the conductive layer and the first inter-wiring insulating layer 132. The conductive layer may include a conductive material, for example, but is not limited to, at least one of tungsten (W), aluminum (Al), and copper (Cu). The barrier layer may include a low migration material, for example, but is not limited to, at least one of titanium (Ti), titanium nitride (TiN), tantalum (Ta) and tantalum nitride (TaN). The material of the barrier layer may, for example, be selected to protect the conductive layer from oxidation (e.g., from oxygen included in the first inter-wiring insulating layer 132) and/or to prevent infiltration between first wiring pattern 134 and the first inter-wiring insulating layer 132.

The first through via 115 may penetrate the first semiconductor substrate 110 in a vertical direction DR2. The first through via 115 may be electrically connected to the first wiring structure 130. For example, the first through via 115 penetrates the first semiconductor substrate 110 and the first semiconductor element layer 120 and may be connected to the lowest layer of the first wiring pattern 134.

The first through via 115 may include a conductive material, for example, but is not limited to, at least one of Cu alloys (such as Cu, CuSn, CuMg, CuNi, CuZn, CuPd, CuAu, CuRe and CuW), W, W alloys, Ni, Ru, Co, and/or the like.

The first connecting pad 142 and the first test pad 144 may be disposed on the first wiring structure 130 to be spaced apart from each other in a horizontal direction (e.g., the horizontal direction DR1). Here, the horizontal direction DR1 may be defined as a direction perpendicular to the vertical direction DR2. Further, the horizontal direction DR1 may be defined as a direction parallel to the second surface 110b of the first semiconductor substrate 110.

Each of the first connecting pad 142 and the first test pad 144 may be electrically connected to the first wiring structure 130. For example, at least a part of the first connecting pad 142 may be disposed inside the first inter-wiring insulating layer 132. The first connecting pad 142 disposed inside the first inter-wiring insulating layer 132 may be electrically connected to the first wiring pattern 134. Further, for example, at least a part of the first test pad 144 may be disposed inside the first inter-wiring insulating layer 132. The first test pad 144 disposed inside the first inter-wiring insulating layer 132 may be electrically connected to the first wiring pattern 134.

For example, a plurality of first test pads 144 may be disposed on both sides of the first connecting pad 142. The arrangement and number of the first connecting pads 142 and the first test pads 144 are merely examples and the embodiments are not limited to those shown in FIG. 1. Further, although FIG. 1 shows that the first wiring pattern 134 connected to the first connecting pad 142, and the first wiring pattern 134 connected to the first test pad 144 are not connected to each other, this is merely an example, and the embodiments are not limited thereto. In some other embodiments, the first wiring pattern 134 connected to the first connecting pad 142 and the first wiring pattern 134 connected to the first test pad 144 may be electrically connected.

Each of the first connecting pad 142 and the first test pad 144 may include, for example, aluminum (Al), but the example embodiments are not limited thereto. In some other embodiments, each of the first connecting pad 142 and the first test pad 144 may include, for example, at least one of tungsten (W) and/or copper (Cu). In some example embodiments, the upper surface of the first test pad 144 may include a groove 144h. The groove 144h of the first test pad 144 may be formed in a test process on the first semiconductor chip 100.

In some example embodiments, each of the first connecting pad 142 and the first test pad 144 may protrude from the first wiring structure 130 in the vertical direction DR2. For example, the upper surface of the first connecting pad 142 and the upper surface of the first test pad 144 may be formed to be higher than the upper surface of the first wiring structure 130. In some example embodiments, a width W1 of the first connecting pad 142 in the horizontal direction DR1 may be smaller than a width W2 of the first test pad 144 in the horizontal direction DR1.

The first passivation layer 152 may be disposed on the first wiring structure 130, the first connecting pad 142, and the first test pad 144. For example, the first passivation layer 152 may be conformally disposed along the profiles of the first wiring structure 130, the first connecting pad 142, and the first test pad 144. The first passivation layer 152 may protect the first connecting pad 142 and the first test pad 144 from external impact and/or moisture. The first passivation layer 152 may include an insulator material, for example, but is not limited to, at least one of a silicon oxide, a silicon nitride, a silicon oxynitride, and/or the like.

The first interlayer insulating layer 154 may be disposed on the first passivation layer 152. The first interlayer insulating layer 154 may cover the upper surface of the first passivation layer 152. For example, the first interlayer insulating layer 154 may include a flattened upper surface. The first interlayer insulating layer 154 may include an insulator material, for example, but is not limited to, at least one of a silicon oxide, a silicon nitride, a silicon oxynitride, and/or the like. For example, the first interlayer insulating layer 154 may include TEOS (tetraethyl orthosilicate).

The first liner layer 162 may be disposed on the first interlayer insulating layer 154. The first liner layer 162 may cover the upper surface of the first interlayer insulating layer 154. For example, the first liner layer 162 may conformally extend along the upper surface of the first interlayer insulating layer 154. The first liner layer 162 may include an insulator material, for example, but is not limited to, at least one of silicon oxide, silicon nitride, silicon oxynitride, and/or the like. For example, the first liner layer 162 may include a material different from that of the first interlayer insulating layer 154. For example, in at least one example embodiment, the first interlayer insulating layer 154 may include silicon oxide, and the first liner layer 162 may include silicon nitride.

The first front side bonding pad 172 may be disposed on the first connecting pad 142. The first front side bonding pad 172 penetrates the first passivation layer 152, the first interlayer insulating layer 154, and the first liner layer 162 in the vertical direction DR2, and may be connected to the first connecting pad 142. A part of the side wall of the first front side bonding pad 172 may be surrounded by the first liner layer 162.

For example, the upper surface of the first front side bonding pad 172 may be formed on the same plane as the upper surface of the first liner layer 162. In some example embodiments, a width W3 of the first front side bonding pad 172 in the horizontal direction DR1 may be 7 μm to 10 μm. For example, the width W3 of the first front side bonding pad 172 in the horizontal direction DR1 may be smaller than the width W1 of the first connecting pad 142 in the horizontal direction DR1. However, the example embodiments are not limited thereto. For example, the height of the first front side bonding pad 172 in the vertical direction DR2 may be 2 μm to 3 μm.

The first front side bonding pad 172 may include, for example, copper (Cu). However, the example embodiments are not limited thereto. For example, in some embodiments, the first front side bonding pad 172 may include at least one of tungsten (W) and/or aluminum (Al).

The first dummy pad 180 may be disposed on the first test pad 144. The first dummy pad 180 penetrates the first passivation layer 152, the first interlayer insulating layer 154, and the first liner layer 162 in the vertical direction DR, and may be connected to the first test pad 144. A part of the side wall of the first dummy pad 180 may be surrounded by the first liner layer 162.

For example, the upper surface of the first dummy pad 180 may be formed on the same plane as the upper surface of the first liner layer 162. Further, the upper surface of the first dummy pad 180 may be formed on the same plane as the upper surface of the first front side bonding pad 172. In some example embodiments, a width W5 of the first dummy pad 180 in the horizontal direction DR1 may be smaller than the width W2 of the first test pad 144 in the horizontal direction DR1. Further, the width W5 of the first dummy pad 180 in the horizontal direction DR1 may be larger than the width W3 of the first front side bonding pad 172 in the horizontal direction DR1. However, the example embodiments are not limited thereto.

In some example embodiments, the first dummy pad 180 may include the same material as the first front side bonding pad 172. For example, the first dummy pad 180 may include, for example, copper (Cu). However, the example embodiments are not limited thereto. In some embodiments, the first dummy pad 180 may include at least one of tungsten (W) and/or aluminum (Al).

The second interlayer insulating layer 156 may be disposed on the first liner layer 162. The second interlayer insulating layer 156 may cover the upper surface of the first liner layer 162. The second interlayer insulating layer 156 may be in contact with at least a part of the upper surface of the first front side bonding pad 172. The second interlayer insulating layer 156 may completely cover the upper surface of the first dummy pad 180. In some example embodiments, the second interlayer insulating layer 156 may include a flattened upper surface. The second interlayer insulating layer 156 may include an insulator material, for example, but is not limited to, at least one of silicon oxide, silicon nitride, silicon oxynitride, and/or the like. For example, the second interlayer insulating layer 156 may include TEOS (tetraethyl orthosilicate).

The second liner layer 164 may be disposed on the second interlayer insulating layer 156. The second liner layer 164 may cover the upper surface of the second interlayer insulating layer 156. For example, the second liner layer 164 may conformally extend along the upper surface of the second interlayer insulating layer 156. The second liner layer 164 may include an insulator material, for example, but is not limited to at least one of silicon oxide, silicon nitride silicon oxynitride, and/or the like. For example, the second liner layer 164 may include a material different from that of the second interlayer insulating layer 156. For example, in at least one example embodiment, the second interlayer insulating layer 156 may include silicon oxide, and the second liner layer 164 may include silicon nitride.

The second front side bonding pad 174 may be disposed on the first front side bonding pad 172. The second front side bonding pad 174 penetrates the second interlayer insulating layer 156 and the second liner layer 164 in the vertical direction DR2, and may be connected to the first front side bonding pad 172. A part of the side wall of the second front side bonding pad 174 may be surrounded by the second interlayer insulating layer 156. Further, the remaining part of the side wall of the second front side bonding pad 174 may be surrounded by the second liner layer 164.

For example, the upper surface of the second front side bonding pad 174 may be formed on the same plane as the upper surface of the second liner layer 164. In some example embodiments, a width W4 of the second front side bonding pad 174 in the horizontal direction DR1 may be 5 μm to 8 μm. The width W4 of the second front side bonding pad 174 in the horizontal direction DR1 may be different from the width W3 of the first front side bonding pad 172 in the horizontal direction DR1. For example, the width W4 of the second front side bonding pad 174 in the horizontal direction DR1 may be smaller than the width W3 of the first front side bonding pad 172 in the horizontal direction DR1. For example, the height of the second front side bonding pad 174 in the vertical direction DR2 may be 0.5 μm to 1.5 μm.

In some example embodiments, the second front side bonding pad 174 may include the same (or a different) material as the first front side bonding pad 172, but with a nanotwin crystal structure. For example, the second front side bonding pad 174 may include copper (Cu) having a nanotwin crystal structure different from a crystal structure of copper (Cu) included in the first front side bonding pad 172. The nanotwin crystal structure may, for example, include a grain structure including a nano-scale twin boundary, wherein the crystal lattices at the edge of the grain and the twin boundary are linked across an imaginary twin plane (e.g., through mirror symmetry). Therefore, the boundary (and/or interface) between grains in the nanotwin crystal structure may lack (and/or include fewer) dislocation defects compared to an equivalent crystal structure without the nanotwin crystal structure. Copper (Cu) having the nanotwin crystal structure included in the second front side bonding pad 174 may have higher electrical conductivity and higher mechanical strength than copper (Cu) included in the first front side bonding pad 172.

The first back insulating layer 190 may be disposed on the first surface 110a of the first semiconductor substrate 110.

The first back insulating layer 190 may cover the first surface 110a of the first semiconductor substrate 110. The first back insulating layer 190 may include an insulator material, for example, but is not limited to, at least one of silicon oxide, silicon nitride, silicon oxynitride; and/or the like. For example, in some embodiments, the first back insulating layer 190 may include a silicon oxide film.

The first back side bonding pad 195 may be formed on the first surface 110a of the first semiconductor substrate 110. The side wall of the first back side bonding pad 195 may be surrounded by the first back insulating layer 190. For example, a lower surface of the first back side bonding pad 195 may be formed on the same plane as a lower surface of the first back insulating layer 190. The first back side bonding pad 195 may be electrically connected to the first through via 115. The first back side bonding pad 195 may include a conductive material, for example, but is not limited to, at least one of tungsten (W), aluminum (Al), copper (Cu), and/or the like.

The second semiconductor chip 200 may include a second semiconductor substrate 210, a second through via 215, a second semiconductor element layer 220, a second wiring structure 230, a second connecting pad 242, a second test pad 244, a second passivation layer 252, a third interlayer insulating layer 254, a third liner layer 262, a fourth interlayer insulating layer 256, a fourth liner layer 264, a third front side bonding pad 272, a fourth front side bonding pad 274, a second dummy pad 280, a second back insulating layer 290, and a second back side bonding pad 295.

The second semiconductor chip 200 may be disposed on the first semiconductor chip 100. The second semiconductor substrate 210 may include a first surface 210a facing the first semiconductor chip 100, and a second surface 210b opposite to the first surface 210a. The second back insulating layer 290 and the second back side bonding pad 295 disposed on the first surface 210a of the second semiconductor substrate 210 may be bonded to the first semiconductor chip 100.

In some embodiments, the second semiconductor chip 200 may be bonded to the first semiconductor chip 100 by a D2W (Die to Wafer) type. For example, the second back side bonding pad 295 of the second semiconductor chip 200 may be bonded to the second front side bonding pad 174 of the first semiconductor chip 100. As a result, the second semiconductor chip 200 may be electrically connected to the first semiconductor chip 100. The first test pad 144 of the first semiconductor chip 100 may be electrically insulated from the second semiconductor chip 200.

In some embodiments, the first semiconductor chip 100 and the second semiconductor chip 200 may be bonded by a hybrid bonding type. The hybrid bonding type may refer to a bonding type in which a metal and an insulating film (for example, an oxide) and/or a metal and a polymer are bonded at the same time. For example, the second front side bonding pad 174 may be attached to the second back side bonding pad 295, and the second liner layer 164 may be attached to the second back insulating layer 290. In at least one example embodiment, the first semiconductor chip 100 and the second semiconductor chip 200 may be bonded by a copper-oxide hybrid bonding type.

In some embodiments, the first semiconductor chip 100 and the second semiconductor chip 200 may be bonded by a metal bonding type. For example, the second front side bonding pad 174 may be attached to the second back side bonding pad 295, and the second liner layer 164 may be spaced apart from the second back insulating layer 290. As an example, the first semiconductor chip 100 and the second semiconductor chip 200 may be bonded by a copper-to-copper bonding type.

The second semiconductor element layer 220 and the second wiring structure 230 may be sequentially stacked on the second surface 210b of the second semiconductor substrate 210. The second wiring structure 230 may include a second wiring pattern 234, and a second inter-wiring insulating layer 232 that surrounds the second wiring pattern 234. The second through via 215 may penetrate the second semiconductor substrate 210 and the second semiconductor element layer 220 in the vertical direction DR2. The second through via 215 may electrically connect the second back side bonding pad 295 and the second wiring pattern 234. For example, the second wiring pattern 234 may be electrically connected to the second front side bonding pad 174 through the second back side bonding pad 295 and the second through via 215.

The second connecting pad 242, the second test pad 244, the second passivation layer 252, the third interlayer insulating layer 254, the third liner layer 262, the fourth interlayer insulating layer 256, the fourth liner layer 264, the third front side bonding pad 272, the fourth front side bonding pad 274, and the second dummy pad 280 may be disposed on the second wiring structure 230. Each of the second connecting pad 242, the second test pad 244, the second passivation layer 252, the third interlayer insulating layer 254, the third liner layer 262, the fourth interlayer insulating layer 256, the fourth liner layer 264, the third front side bonding pad 272, the fourth front side bonding pad 274, and the second dummy pad 280 may have the same (and/or substantially similar) structure as each of the first connecting pad 142, the first test pad 144, the first passivation layer 152, the first interlayer insulating layer 154, the first liner layer 162, the second interlayer insulating layer 156, the second liner layer 164, the first front side bonding pad 172, the second front side bonding pad 174, and the first dummy pad 180. respectively. Therefore, a detailed description thereof will not be provided.

As the semiconductor package is continuously required to become smaller, lighter, and have multi-functionality, there is a limit in stacking the semiconductor chips only by the CoW (Chip on Wafer) type. For example, in the case of a connecting member such as a bump or a solder applied to a CoW (Chip on Wafer) type, there is a problem that smooth (or efficient) heat release is limited and it is, therefore, difficult to secure the required thermal properties.

The semiconductor package according to some embodiments of the present disclosure has improved thermal properties, because the semiconductor chips (for example, the first semiconductor chip 100 and the second semiconductor chip 200) may be bonded by the D2W (Die to Wafer) type and/or by a similar type. For example, as described above, the second front side bonding pad 174 of the first semiconductor chip 100 may be bonded to the second back side bonding pad 295 of the second semiconductor chip 200. Further, each of the first front side bonding pad 172, the second front side bonding pad 174, and the second back side bonding pad 295 may include copper (Cu) having a lower thermal resistance and/or higher thermal stability than a connecting member such as a bump and/or a solder. Because the second front side bonding pad 174 is formed to include copper (Cu) having a nanotwin crystal structure (different from the crystal structure of copper (Cu) included in the first front side bonding pad 172) the thermal properties of the semiconductor package can be improved.

Hereinafter, a method for fabricating a semiconductor package according to some embodiments of the present disclosure will be described referring to FIGS. 1 and 3 to 13.

FIGS. 3 to 13 are intermediate step diagrams for explaining the method for fabricating the semiconductor package according to some embodiments of the present disclosure.

Figure 3:
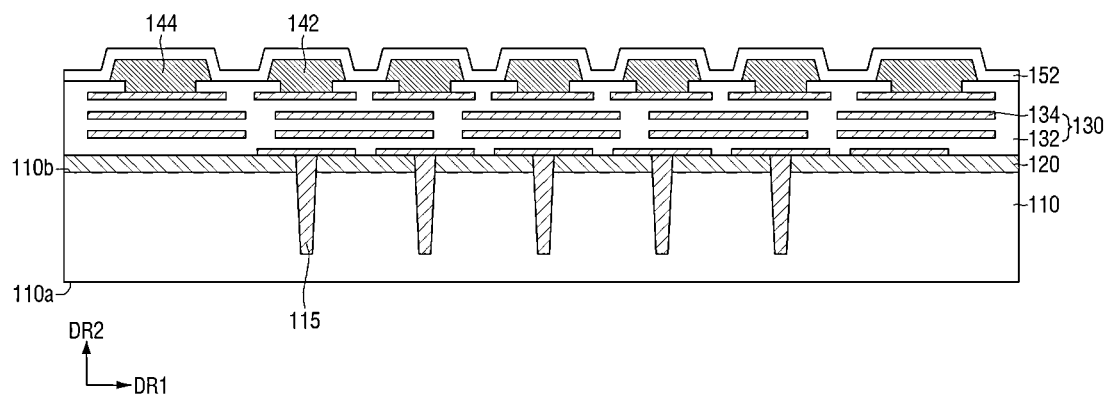
FIGS. 3 to 13 are intermediate step diagrams for explaining a method for fabricating a semiconductor package according to some embodiments of the present disclosure.

Referring to FIG. 3, the first through via 115, the first semiconductor element layer 120, the first wiring structure 130, the first connecting pad 142, the first test pad 144, and the first passivation layer 152 may each be formed on the first semiconductor substrate 110.

For example, the first semiconductor substrate 110 including the first surface 110a and the second surface 110b may be provided. The first semiconductor element layer 120 may be formed on the second surface 110b of the first semiconductor substrate 110. The first through via 115 may be formed inside the first semiconductor substrate 110 and the first semiconductor element layer 120. The first wiring structure 130 may be formed on the first semiconductor element layer 120. The first connecting pad 142 and the first test pad 144 may be formed on the first wiring structure 130 to be spaced apart from each other in the horizontal direction DR1.

Subsequently, the first passivation layer 152 may be formed on the first wiring structure 130, the first connecting pad 142, and the first test pad 144. The first passivation layer 152 may conformally extend along the profiles of the first wiring structure 130, the first connecting pad 142, and the first test pad 144. The first passivation layer 152 may be formed by, for example, but is not limited to, a HDP (High density plasma chemical vapor deposition) process.

Figure 4:
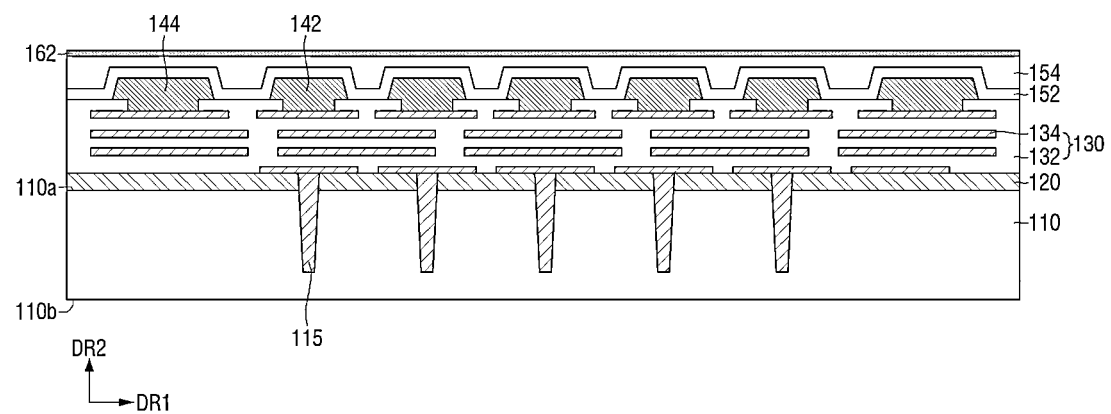

Referring to FIG. 4, the first interlayer insulating layer 154 and the first liner layer 162 may be sequentially formed on the first passivation layer 152.

For example, the first interlayer insulating layer 154 that covers the first passivation layer 152 may be formed. The first interlayer insulating layer 154 may be formed by, for example, but is not limited to, a plasma enhanced chemical vapor deposition (PECVD), a low temperature chemical vapor deposition (LT CVD), an atomic layer deposition (ALD), and/or the like.

Subsequently, the first liner layer 162 that covers the first interlayer insulating layer 154 may be formed. For example, before the first liner layer 162 is formed, a flattening process may be performed on the first interlayer insulating layer 154. The flattening process may include, for example, but is not limited to, a chemical mechanical polishing (CMP) process. Therefore, the first liner layer 162 may extend along the flattened upper surface of the first interlayer insulating layer 154.

Figure 5:
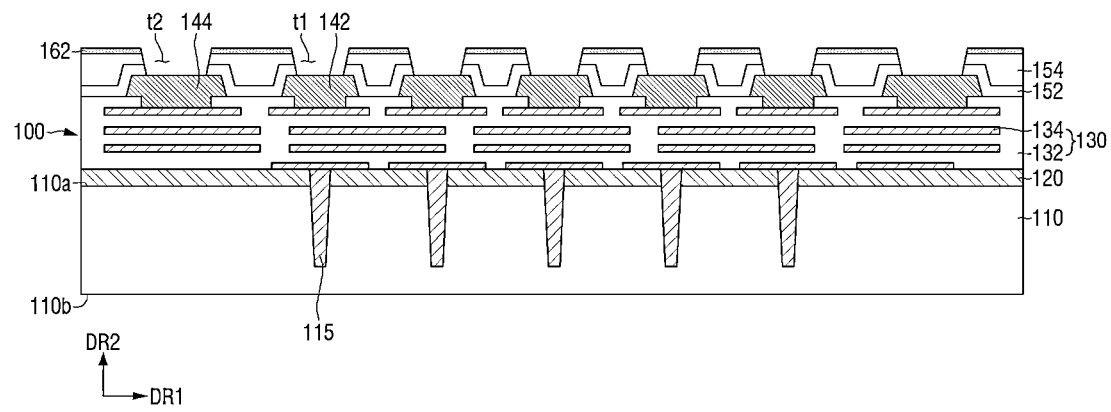

Referring to FIG. 5, a first trench T1 and a second trench T2 may each be formed inside the first passivation layer 152, the first interlayer insulating layer 154, and the first liner layer 162. For example, the first passivation layer 152, the first interlayer insulating layer 154, and the first liner layer 162 may be etched by the dry etching process to form the first trench T1 and the second trench T2. The first trench T1 may expose at least a part of the upper surface of the first connecting pad 142 and, the second trench T2 may expose at least a part of the upper surface of the first test pad 144.

Figure 6:
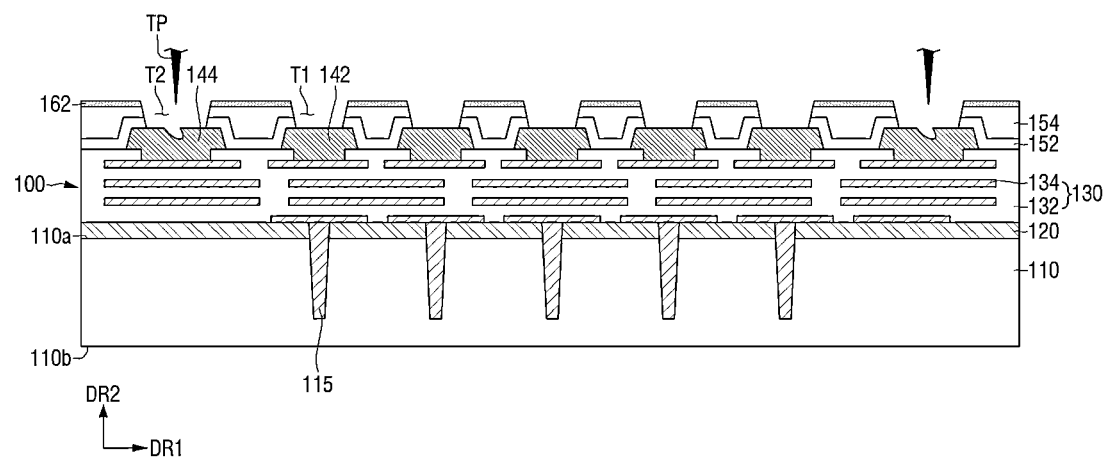

Referring to FIG. 6, the test process may be performed on the first test pad 144 through the second trench T2.

The test process may be performed to inspect the function and electrical connection of the first semiconductor chip 100. For example, a test device including a probe TP may be provided. The test device may perform the test process by bringing the probe TP into physical contact with the first test pad 144. Such a contact type test process may have relatively high performance as compared to a non-contact test process.

In some example embodiments, the groove 144h may be formed in the exposed first test pad 144 of the second trench T2. For example, in the test process, as the probe TP comes into physical contact with the first test pad 144, the groove 144h may be formed on the upper surface of the first test pad 144.

Figure 7:
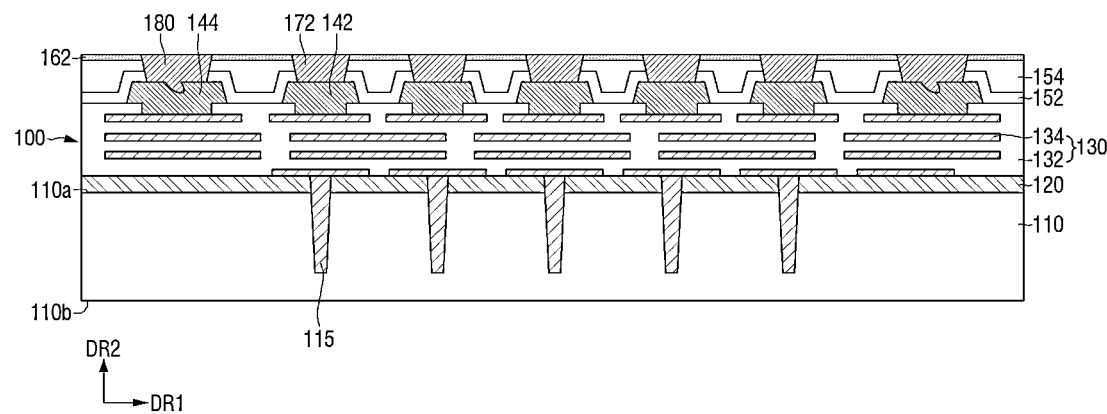

Referring to FIG. 7, the first front side bonding pad 172 may be formed inside the first trench T1. Further, the dummy pad 180 may be formed inside the second trench T2 by the same process.

For example, the upper surface of the first front side bonding pad 172, the upper surfaces of the dummy pad 180, and the first liner layer 162 may be formed on the same plane. In some example embodiments, the first front side bonding pad 172 and the dummy pad 180 may be formed through the same process. For example, the first front side bonding pad 172 and the dummy pad 180 may include the same material. For example, each of the first front side bonding pad 172 and the dummy pad 180 may include copper (Cu).

Figure 8:
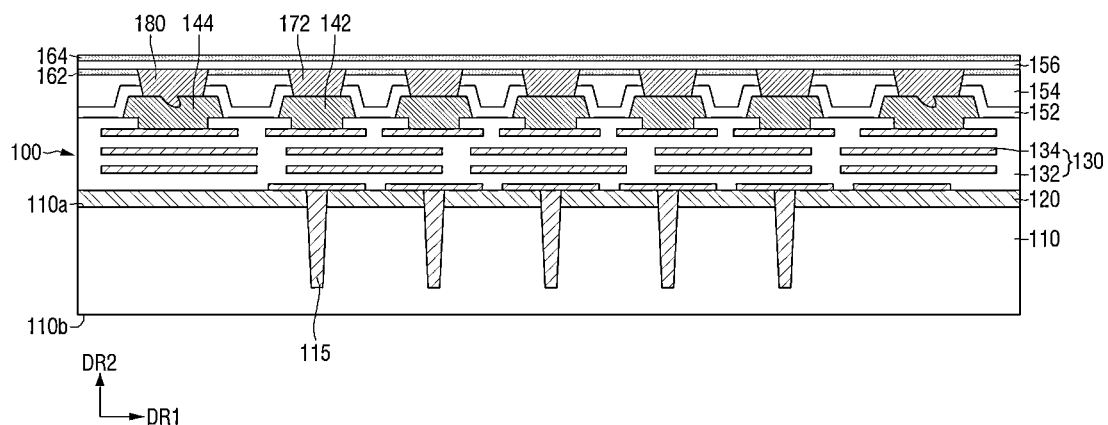

Referring to FIG. 8, the second interlayer insulating layer 156 and the second liner layer 164 may be sequentially formed on the first liner layer 162.

For example, a second interlayer insulating layer 156 that covers the first liner layer 162, the upper surface of the first front side bonding pad 172, and the upper surface of the dummy pad 180 may be formed. Subsequently, the second liner layer 164 may be formed on the second interlayer insulating layer 156. For example, before forming the second liner layer 164, a flattening process may be performed on the second interlayer insulating layer 156. The flattening process may include, for example, but is not limited to, a chemical mechanical polishing (CMP) process. Therefore, the second liner layer 164 may extend along the flattened upper surface of the second interlayer insulating layer 156.

Figure 9:
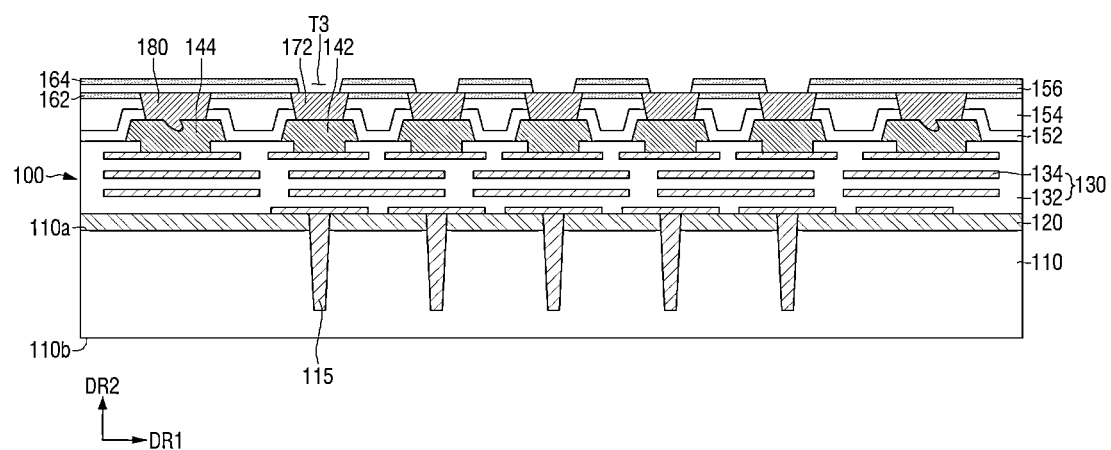

Referring to FIG. 9, a third trench T3 may be formed inside the second interlayer insulating layer 156 and the second liner layer 164. For example, the second interlayer insulating layer 156 and the second liner layer 164 may be etched through the dry etching process to form the third trench T3. The third trench T3 may expose at least a part of the upper surface of the first front side bonding pad 172.

Figure 10:
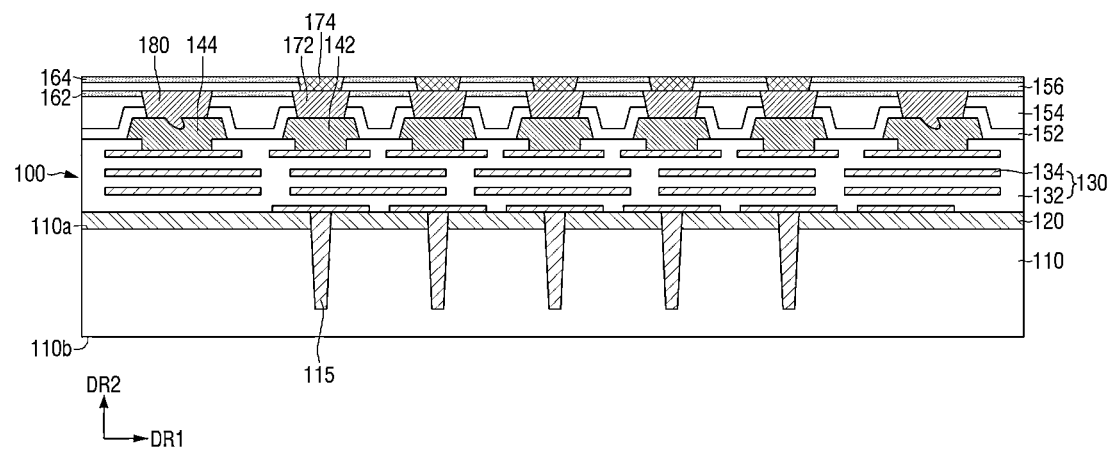

Referring to FIG. 10, the second front side bonding pad 174 may be formed inside the third trench T3. For example, the upper surface of the second front side bonding pad 174 may be formed on the same plane as the upper surface of the second liner layer 164. For example, the second front side bonding pad 174 may include copper (Cu) having a nanotwin crystal structure different from the crystal structure of copper (Cu) included in the first front side bonding pad 172.

Figure 11:
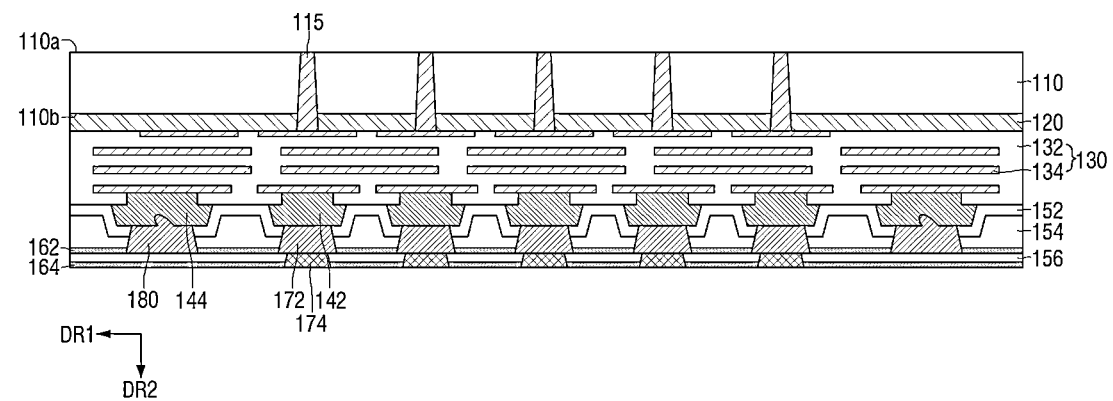

Referring to FIG. 11, a recess process is performed on the first surface 110a of the first semiconductor substrate 110. For example, a back grinding process may be performed on the first surface 110a of the first semiconductor substrate 110. A part of the first through via 115 may be exposed through the recess process. For example, the recess step may be performed, until the first surface 110a of the first semiconductor substrate 110 becomes lower than the upper surface of the first through via 115. In this case, the first through via 115 including a protruding portion that protrudes from the first surface 110a of the first semiconductor substrate 110 may be formed.

Subsequently, a flattening process may be performed on the first through via 115 protruding from the first surface 110a of the first semiconductor substrate 110. The flattening process may include, for example, but is not limited to, a chemical mechanical polishing (CMP) process. As a result, the protruding portion of the first through via 115 may be removed from the first surface 110a of the first semiconductor substrate 110.

Figure 12:
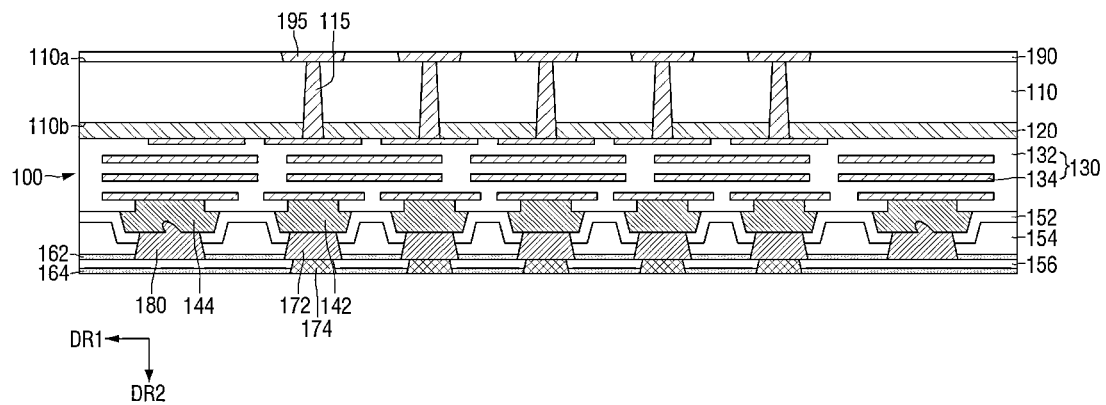

Referring to FIG. 12, the first back insulating layer 190 may be formed on the first surface 110a of the first semiconductor substrate 110. Subsequently, the first back insulating layer 190 may be etched through the dry etching process to form a trench through which the first through via 115 is exposed. Subsequently, the first back side bonding pad 195 may be formed inside the trench. For example, the upper surface of the first back side bonding pad 195 may be formed on the same plane as the upper surface of the first back insulating layer 190. The first semiconductor chip 100 may be fabricated through such a fabricating process.

Figure 13:
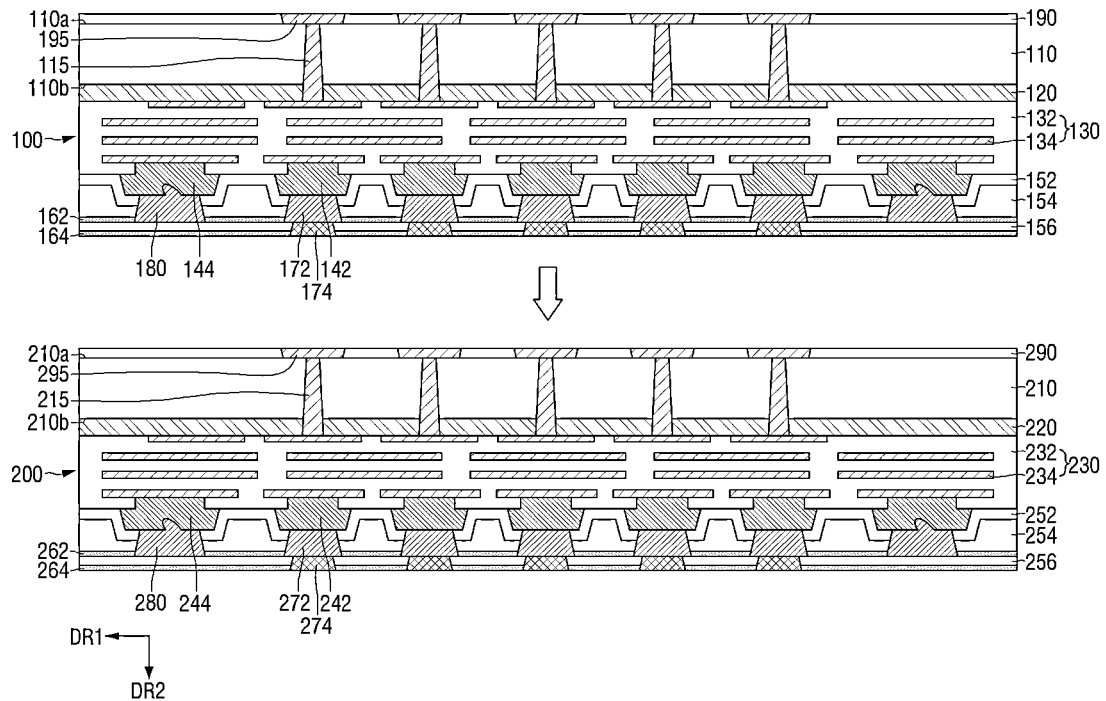

Referring to FIG. 13, a second semiconductor chip 200 fabricated through the same (and/or a substantially similar) fabricating process as the first semiconductor chip 100 may be provided. The first semiconductor chip 100 may be bonded onto the second semiconductor chip 200. In at least one example embodiment, the first semiconductor chip 100 and the second semiconductor chip 200 may be bonded by the D2W (Die to Wafer) type. For example, the second front side bonding pad 174 of the first semiconductor chip 100 may be bonded to the second back side bonding pad 295 of the second semiconductor chip 200. Accordingly, the first semiconductor chip 100 and the second semiconductor chip 200 may be electrically connected. The semiconductor package shown in FIG. 1 may be fabricated through such a fabricating process. The semiconductor package shown in FIG. 1 shows a state in which the semiconductor package fabricated through the fabricating process shown in FIG. 13 is turned upside down.

Hereinafter, a semiconductor package according to some other embodiments of the present disclosure will be described referring to FIG. 14. Differences from the semiconductor package shown in FIGS. 1 and 2 will be mainly described.

Figure 14:
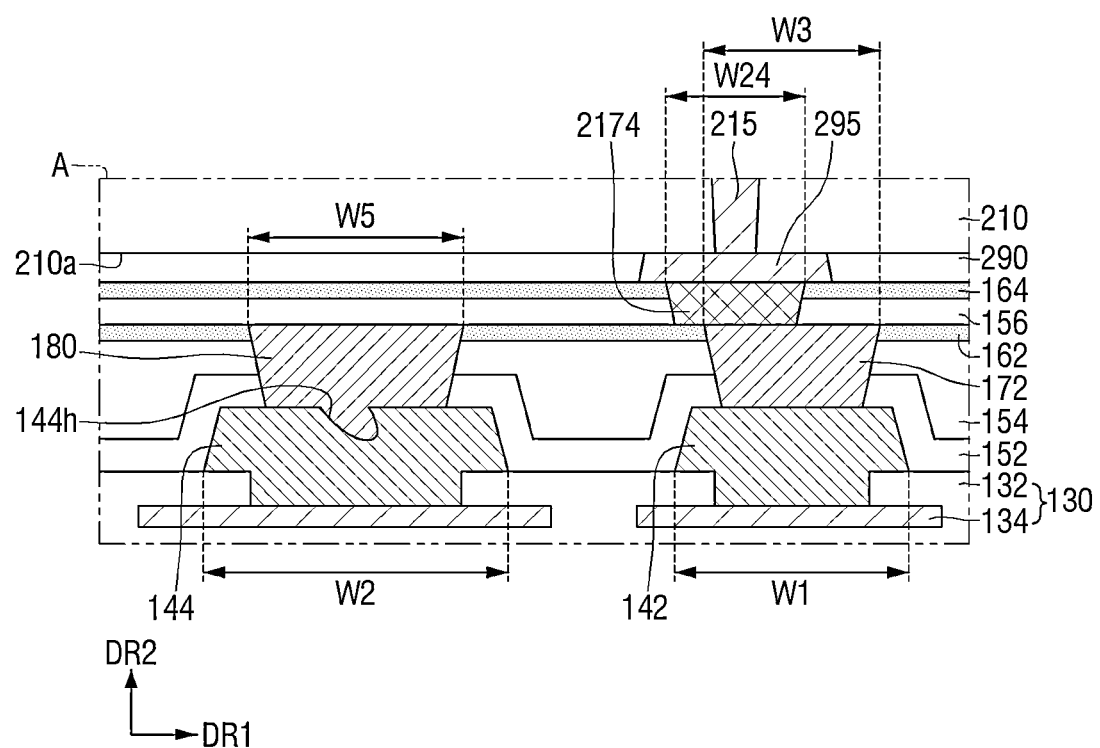
FIG. 14 is an enlarged view for explaining a semiconductor package according to some embodiments of the present disclosure.

FIG. 14 is an enlarged view for explaining a semiconductor package according to some embodiments of the present disclosure.

Referring to FIG. 14, in the semiconductor package according to some other embodiments of the present disclosure, a second front side bonding pad 2174 may be misaligned with the first front side bonding pad 172 in the vertical direction DR2.

For example, at least a part of the second front side bonding pad 2174 may not overlap the first front side bonding pad 172 in the vertical direction DR2. For example, at least a part of the second front side bonding pad 2174 may be in contact with the upper surface of the first liner layer 162. In some example embodiments, a width W24 of the second front side bonding pad 2174 in the horizontal direction DR1 may be smaller than the width W3 of the first front side bonding pad 172 in the horizontal direction DR1. However, the example embodiments are not limited thereto.

Hereinafter, a semiconductor package according to some other embodiments of the present disclosure will be described referring to FIG. 15. Differences from the semiconductor package shown in FIGS. 1 and 2 will be mainly described.

Figure 15:
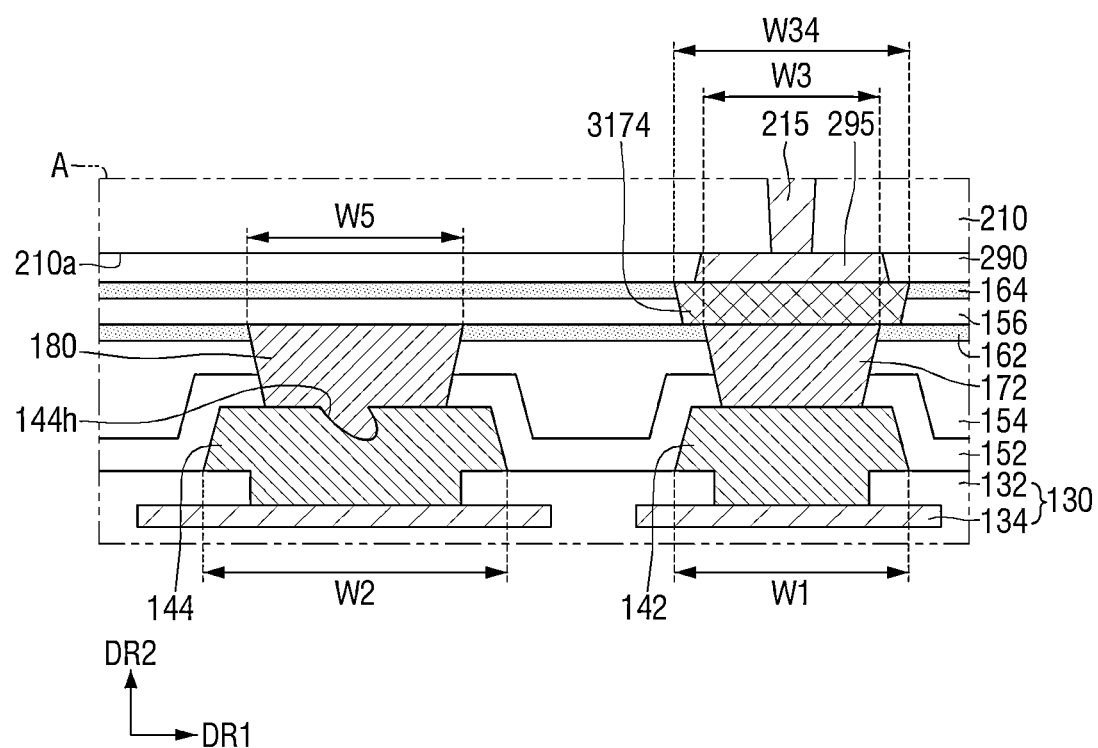
FIG. 15 is an enlarged view for explaining a semiconductor package according to some embodiments of the present disclosure.

FIG. 15 is an enlarged view for explaining a semiconductor package according to some embodiments of the present disclosure.

Referring to FIG. 15, in the semiconductor package according to still some other embodiments of the present disclosure, a width W34 of the second front side bonding pad 3174 in the horizontal direction DR1 may be larger than the width W3 of the first front side bonding pad 172 in the horizontal direction DR1. For example, both side walls of the second front side bonding pad 3174 may protrude laterally from the first front side bonding pad 172 in the horizontal direction DR1. For example, a part of the second front side bonding pad 3174 protruding laterally from the first front side bonding pad 172 in the horizontal direction DR1 may be in contact with the upper surface of the first liner layer 162.

Hereinafter, a semiconductor package according to some other embodiments of the present disclosure will be described referring to FIG. 16. Differences from the semiconductor package shown in FIGS. 1 and 2 will be mainly described.

Figure 16:
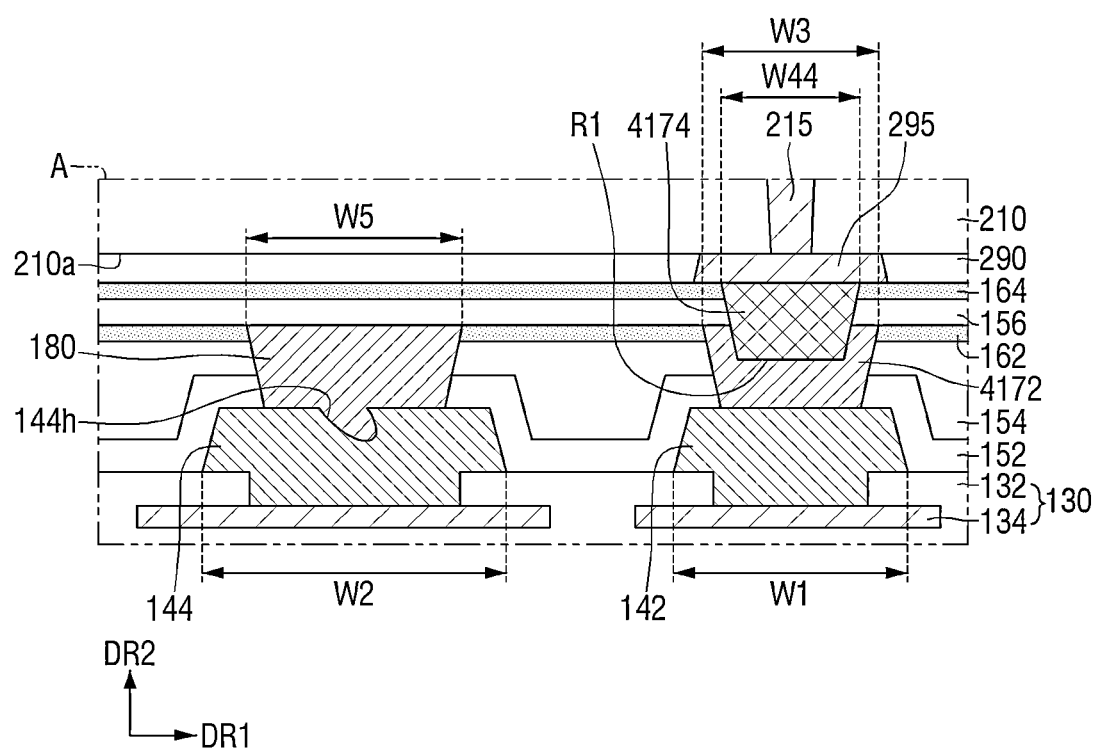
FIG. 16 is an enlarged view for explaining a semiconductor package according to some embodiments of the present disclosure.

FIG. 16 is an enlarged view for explaining a semiconductor package according to some embodiments of the present disclosure.

Referring to FIG. 16, in the semiconductor package according to some other embodiments of the present disclosure, a part of a second front side bonding pad 4174 may be disposed inside the first front side bonding pad 4172.

For example, a recess R1 may be formed inside the first front side bonding pad 4172. The recess R1 may extend from the upper surface of the first front side bonding pad 4172 formed on the same plane as the upper surface of the first liner layer 162 to the inside of the first front side bonding pad 4172. A part of the second front side bonding pad 4174 may be disposed inside the recess R1. For example, a part of the second front side bonding pad 4174 disposed inside the recess R1 may be surrounded by the first front side bonding pad 4172. For example, a width W44 of the second front side bonding pad 4174 in the horizontal direction DR1 may be smaller than the width W3 of the first front side bonding pad 4172 in the horizontal direction DR1. In some example embodiments, the first front side bonding pad 4172 and the second front side bonding pad 4174 may aligned, as illustrated in FIG. 16 or misaligned.

Hereinafter, a semiconductor package according to some other embodiments of the present disclosure will be described referring to FIG. 17. Differences from the semiconductor packages shown in FIGS. 1 and 2 will be mainly described.

Figure 17:
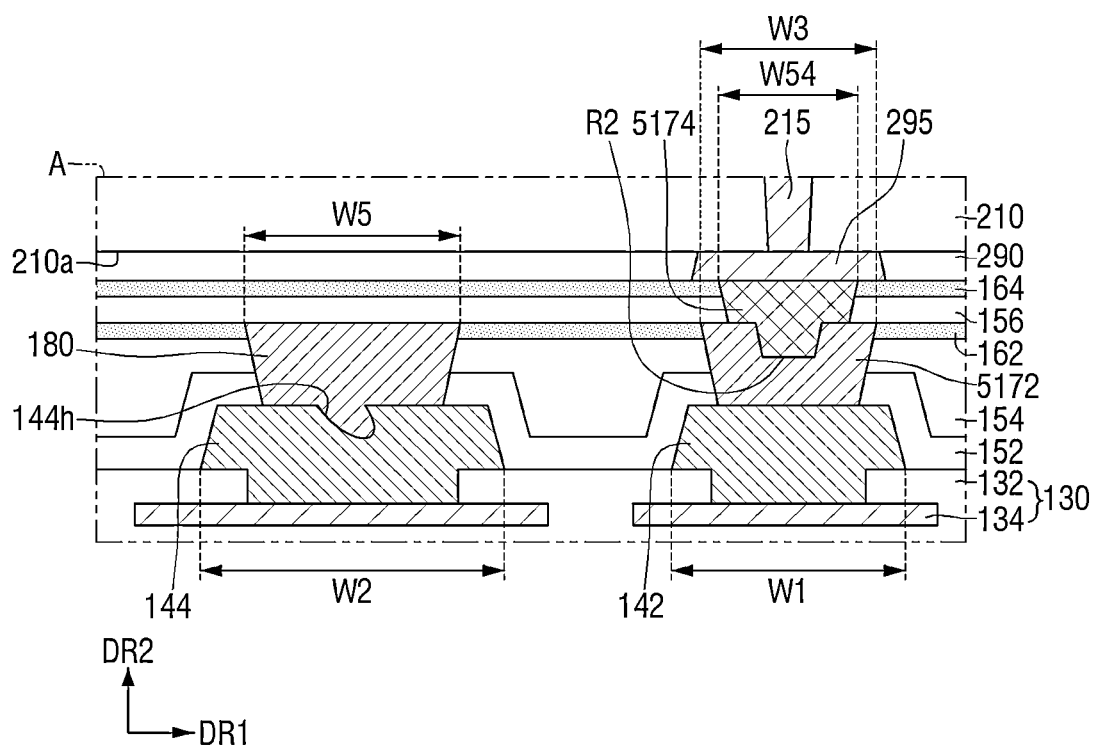
FIG. 17 is an enlarged view for explaining a semiconductor package according to some embodiments of the present disclosure.

FIG. 17 is an enlarged view for explaining a semiconductor package according to some embodiments of the present disclosure.

Referring to FIG. 17, in a semiconductor package according to still some other embodiments of the present disclosure, a part of a second front side bonding pad 5174 may be disposed inside a first front side bonding pad 5172.

For example, a recess R2 may be formed inside the first front side bonding pad 5172. The recess R2 may extend from the upper surface of the first front side bonding pad 5172 formed on the same plane as the upper surface of the first liner layer 162 to the inside of the first front side bonding pad 5172. A part of the second front side bonding pad 5174 may be disposed inside the recess R2. That is, a part of the second front side bonding pad 5174 disposed inside the recess R2 may be surrounded by the first front side bonding pad 5172.

At least a part of the remaining part of the second front side bonding pad 5174 disposed on a part of the second front side bonding pad 5174 disposed inside the recess R2 may be in contact with the uppermost surface of the first front side bonding pad 5172. For example, a width W54 of the second front side bonding pad 5174 in the horizontal direction DR1 may be smaller than the width W3 of the first front side bonding pad 5172 in the horizontal direction DR1. In some example embodiments, the first front side bonding pad 5172 and the second front side bonding pad 5174 may aligned, as illustrated in FIG. 17 or misaligned.

Hereinafter, a semiconductor package according to still some other embodiments of the present disclosure will be described referring to FIGS. 1 and 18. Differences from the semiconductor package shown in FIGS. 1 and 2 will be mainly described.

Figure 18:
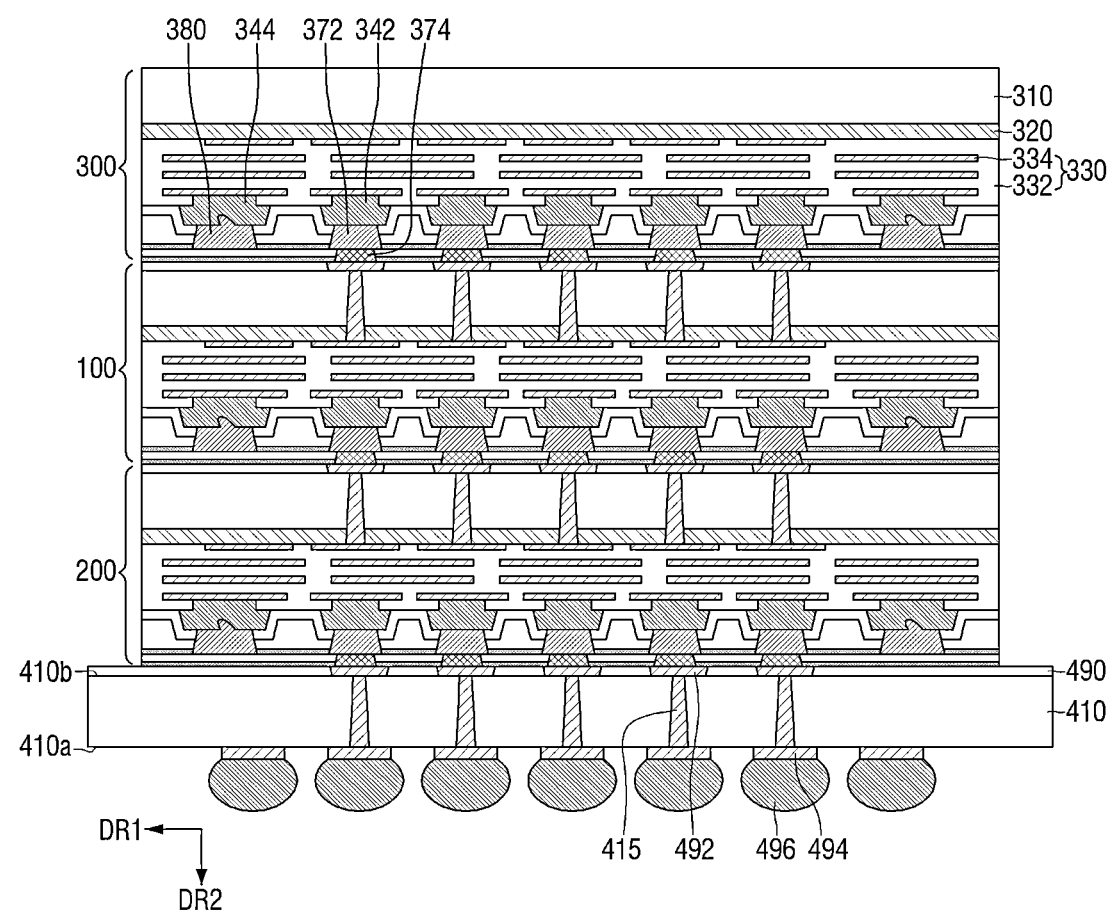
FIG. 18 is a schematic cross-sectional view for explaining a semiconductor package according to some embodiments of the present disclosure.

FIG. 18 is a schematic cross-sectional view for explaining a semiconductor package according to some embodiments of the present disclosure.

Referring to FIGS. 1 and 18, a semiconductor package according to some embodiments of the disclosure may include a buffer substrate 410 and semiconductor chip stacks 200, 100, and 300.

The buffer substrate 410 may be a package substrate that constitutes the semiconductor package. In some embodiments, the buffer substrate 410 may be a printed circuit board (PCB), a ceramic substrate, an interposer, and/or the like. In some other embodiments, the buffer substrate 410 may be a substrate for a wafer level package (WLP) fabricated at a wafer level. In still some other embodiments, the buffer substrate 410 may be a semiconductor chip including a semiconductor element. The buffer substrate 410 may include a first surface 410a, and a second surface 410b opposite to the first surface 410a.

A buffer substrate insulating layer 490 may be disposed on the second surface 410b of the buffer substrate 410. The buffer substrate insulating layer 490 may include, for example, but is not limited to, at least one of silicon oxide, silicon nitride, silicon oxynitride, and/or the like. In some embodiments, the buffer substrate insulating layer 490 may include a silicon oxide film.

A first buffer substrate bonding pad 492 may be disposed on the second surface 410b of the buffer substrate 410. The side wall of the first buffer substrate bonding pad 492 may be surrounded by the buffer substrate insulating layer 490. For example, the upper surface of the first buffer substrate bonding pad 492 may be formed on the same plane as the upper surface of the buffer substrate insulating layer 490. The second buffer substrate bonding pad 494 may be disposed on the first surface 410a of the buffer substrate 410. Each of the first buffer substrate bonding pad 492 and the second buffer substrate bonding pad 494 may include a conductive layer, for example, but is not limited to, at least one of tungsten (W), aluminum (Al), and copper (Cu).

A third through via 415 may penetrate the buffer substrate 410 in the vertical direction DR2. The third through via 415 may come into contact with each of the first buffer substrate bonding pad 492 and the second buffer substrate bonding pad 494. The first buffer substrate bonding pad 492 may be electrically connected to the second buffer substrate bonding pad 494 through the third through via 415. The third through via 415 may include a conductive material, for example, but is not limited to, at least one of Cu alloys (such as Cu, CuSn, CuMg, CuNi, CuZn, CuPd, CuAu, CuRe and CuW), W, W alloys, Ni, Ru, Co, and/or the like.

First solder balls 496 may be connected to the second buffer substrate bonding pads 494 on the first surface 410a of the buffer substrate 410. The first solder balls 496 may be portions that are configured to be electrically connected to an external device (for example, a panel of an electronic device). The first solder balls 496 may include, but are not limited to, a metal such as tin (Sn) and/or an alloy thereof.

The semiconductor package shown in FIG. 1 may be disposed on the second surface 410b of the buffer substrate 410 in a state of being turned upside down. For example, the fourth liner layer 264 and the fourth front side bonding pad 274 of the second semiconductor chip 200 may be bonded to the buffer substrate insulating layer 490 and the first buffer substrate bonding pad 492. The fourth front side bonding pad 274 may be electrically connected to the first buffer substrate bonding pad 492.

For example, the first semiconductor chip 100 may be disposed on the second semiconductor chip 200. The second liner layer 164 and the second front side bonding pad 174 of the first semiconductor chip 100 may be bonded to the second back insulating layer 290 and the second back side bonding pad 295 of the second semiconductor chip 200. The second front side bonding pad 174 may be electrically connected to the second back side bonding pad 295.

A third semiconductor chip 300 may be disposed on the first semiconductor chip 100. For example, the third semiconductor chip 300 may have the same structure as the first semiconductor chip 100 except for the first through via 115, the first back insulating layer 190, and the first back side bonding pad 195 in the first semiconductor chip 100.

For example, each of a third semiconductor substrate 310, a third semiconductor element layer 320, a third wiring structure 330, a third inter-wiring insulating layer 332, a third wiring pattern 334, a third connecting pad 342, a third test pad 344, a fifth front side bonding pad 372, a sixth front side bonding pad 374, and a third dummy pad 380 may have the same (and/or a substantially similar) structure as each of the first semiconductor substrate 110, the first semiconductor element layer 120, the first wiring structure 130, the first inter-wiring insulating layer 132, the first wiring pattern 134, the first connecting pad 142, the first test pad 144, the first front side bonding pad 172, the second front side bonding pad 174, and the first dummy pad 180. For example, the third semiconductor chip 300 may be (and/or include) at least one of an AP, volatile memory, and/or non-volatile memory. Therefore, a detailed description thereof will not be provided.

For example, the sixth front side bonding pad 374 of the third semiconductor chip 300 may be bonded to the first back side bonding pad 195 of the first semiconductor chip 100. The sixth front side bonding pad 374 may be electrically connected to the first back side bonding pad 195.

Although FIG. 18 shows that three semiconductor chips 200, 100, and 300 are stacked on the second surface 410b of the buffer substrate 410, this is merely an example, and the example embodiments are not limited thereto. In some other embodiments, four or more semiconductor chips may be stacked on the second surface 410b of the buffer substrate 410.

Hereinafter, a semiconductor package according to some other embodiments of the present disclosure will be described referring to FIG. 19. Difference from the semiconductor package shown in FIG. 18 will be mainly described.

Figure 19:
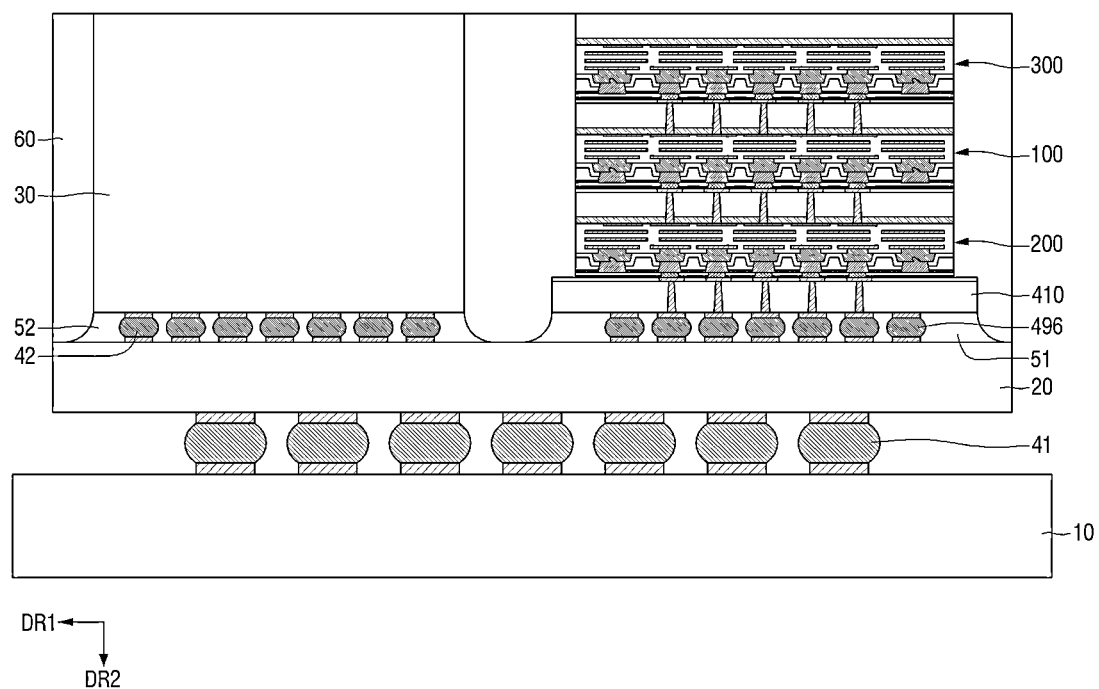
FIG. 19 is a schematic cross-sectional view for explaining a semiconductor package according to some embodiments of the present disclosure.

FIG. 19 is a schematic cross-sectional view for explaining a semiconductor package according to some embodiments of the present disclosure.

Referring to FIG. 19, in a semiconductor package according to some other embodiments of the present disclosure, the semiconductor package shown in FIG. 18 may be disposed on an interposer 20.

For example, the interposer 20 may be disposed on the printed circuit board 10. The interposer 20 may be electrically connected to the printed circuit board 10 through the second solder ball 41. The semiconductor package shown in FIG. 18, which includes the buffer substrate 410, the second semiconductor chip 200, the first semiconductor chip 100, and the third semiconductor chip 300, may be disposed on the interposer 20.

A logic semiconductor chip 30 may be disposed in the interposer 20. The logic semiconductor chip 30 may be spaced apart from the semiconductor package shown in FIG. 18 in the horizontal direction DR1. The logic semiconductor chip 30 may be an integrated circuit (IC) in which a plurality of semiconductor elements is integrated in a single chip. The logic semiconductor chip 30 may be an application processor (AP), such as a CPU (Central Processing Unit), a GPU (Graphic Processing Unit), an FPGA (Field-Programmable Gate Array), a digital signal processor, an encryption processor, a micro-processor, a micro-controller, and an ASIC (Application-Specific IC).

The semiconductor package shown in FIG. 18 may be electrically connected to the interposer 20 through the first solder balls 496. The logic semiconductor chip 30 may be electrically connected to the interposer 20 through third solder balls 42. Each of the second solder balls 41 and the third solder balls 42 may include, for example, but are not limited to, a metal such as tin (Sn).

A first underfill material 51 may surround the first solder balls 496 between the interposer 20 and the buffer substrate 410. A second underfill material 52 may surround the third solder balls 42 between the interposer 20 and the logic semiconductor chip 30. Each of the first underfill material 51 and the second underfill material 52 may include, but is not limited to, an insulating polymer material such as EMC (epoxy molding compound).

A molding layer 60 may cover the first underfill material 51, the second underfill material 52, the logic semiconductor chip 30, and the semiconductor package shown in FIG. 18 on the interposer 20. For example, although the upper surface of the molding layer 60 may be formed on the same plane as the upper surface of the logic semiconductor chip 30 and the upper surface of the third semiconductor chip 300, the example embodiments are not limited thereto.

In concluding the detailed description, those skilled in the art will appreciate that many variations and modifications may be made to the preferred embodiments without substantially departing from the principles of the present disclosure. Therefore, the disclosed preferred embodiments of the disclosure are used in a generic and descriptive sense only and not for purposes of limitation.

What is claimed is:

1. A semiconductor package comprising:
   a first semiconductor substrate;
   a first semiconductor element layer above an upper surface of the first semiconductor substrate;
   a first wiring structure above the first semiconductor element layer;
   a first connecting pad above and connected to the first wiring structure;
   a first test pad above and connected to the first wiring structure, the first test pad spaced apart from the first connecting pad in a horizontal direction;
   a first front side bonding pad above and connected to the first connecting pad, the first front side bonding pad including copper; and
   a second front side bonding pad above and connected to the first front side bonding pad, the second front side bonding pad including copper which has a nanotwin crystal structure different from a crystal structure of the copper included in the first front side bonding pad,
   wherein a width of the first front side bonding pad in the horizontal direction is different from a width of the second front side bonding pad in the horizontal direction.

2. The semiconductor package of claim 1, further comprising:
   a second semiconductor substrate above the second front side bonding pad, the second semiconductor substrate including a lower surface facing the second front side bonding pad;
   a second semiconductor element layer above an upper surface of the second semiconductor substrate;
   a second wiring structure above the second semiconductor element layer;
   a second connecting pad above and connected to the second wiring structure;
   a second test pad above and connected to the second wiring structure, the second test pad spaced apart from the second connecting pad in the horizontal direction;
   a third front side bonding pad above and connected to the second connecting pad, the third front side bonding pad including copper; and
   a fourth front side bonding pad above and connected to the third front side bonding pad, the fourth front side bonding pad including copper having a nanotwin crystal structure different from a crystal structure of the copper included in the third front side bonding pad,
   wherein a width of the third front side bonding pad in the horizontal direction is different from a width of the fourth front side bonding pad in the horizontal direction.

3. The semiconductor package of claim 1, further comprising:
   a dummy pad above and connected to the first test pad, the dummy pad including copper.

4. The semiconductor package of claim 3, wherein an upper surface of the first front side bonding pad is at a same plane as an upper surface of the dummy pad.

5. The semiconductor package of claim 3, wherein the width of the first front side bonding pad in the horizontal direction is smaller than a width of the dummy pad in the horizontal direction.

6. The semiconductor package of claim 3, further comprising:
   an interlayer insulating layer surrounding at least a part of a side wall of the second front side bonding pad, contacting an upper surface of the first front side bonding pad, and completely covering an upper surface of the dummy pad.

7. The semiconductor package of claim 1, wherein a width of the first connecting pad in the horizontal direction is smaller than a width of the first test pad in the horizontal direction.

8. The semiconductor package of claim 1, further comprising:
   a first liner layer surrounding at least a part of a side wall of the first front side bonding pad, and having an upper surface at a same plane as an upper surface of the first front side bonding pad;
   an interlayer insulating layer above the first liner layer, the interlayer insulating layer surrounding a part of a side wall of the second front side bonding pad; and
   a second liner layer above the interlayer insulating layer, the second liner layer surrounding a remaining part of the side wall of the second front side bonding pad and having an upper surface at a same plane as an upper surface of the second front side bonding pad.

9. The semiconductor package of claim 1, wherein the width of the first front side bonding pad in the horizontal direction is larger than the width of the second front side bonding pad in the horizontal direction.

10. The semiconductor package of claim 1, wherein the width of the first front side bonding pad in the horizontal direction is smaller than the width of the second front side bonding pad in the horizontal direction.

11. The semiconductor package of claim 1, wherein a part of the second front side bonding pad does not overlap the first front side bonding pad in a vertical direction.

12. The semiconductor package of claim 1, further comprising:
a recess inside the first front side bonding pad,
wherein a part of a lower surface of the second front side bonding pad is inside the recess.

13. The semiconductor package of claim 12, wherein a remaining part of the lower surface of the second front side bonding pad is in contact with an uppermost surface of the first front side bonding pad.

14. A semiconductor package comprising:
a first semiconductor chip including:
a first semiconductor substrate,
a first semiconductor element layer above an upper surface of the first semiconductor substrate,
a first wiring structure above the first semiconductor element layer,
a first connecting pad above and connected to the first wiring structure,
a first front side bonding pad above and connected to the first connecting pad, and
a second front side bonding pad above and connected to the first front side bonding pad; and
a second semiconductor chip bonded to the first semiconductor chip, the second semiconductor chip including:
a second semiconductor substrate above the second front side bonding pad,
a second semiconductor element layer above an upper surface of the second semiconductor substrate,
a second wiring structure above the second semiconductor element layer,
a second connecting pad above and connected to the second wiring structure,
a third front side bonding pad above and connected to the second connecting pad, and
a fourth front side bonding pad above and connected to the third front side bonding pad,
wherein the first and third front side bonding pads include copper,
wherein the second and fourth front side bonding pads include copper having a nanotwin crystal structure different from a crystal structure of the copper included in the first and third front side bonding pads, and
wherein a width of the first front side bonding pad in a horizontal direction is larger than a width of the second front side bonding pad in the horizontal direction.

15. The semiconductor package of claim 14, further comprising:
a first test pad above and connected to the first wiring structure, the first test pad spaced apart from the first connecting pad in the horizontal direction; and
a second test pad above and connected to the second wiring structure, the second test pad spaced apart from the second connecting pad in the horizontal direction,
wherein a width of the first connecting pad and a width of the second connecting pad in the horizontal direction are, respectively, smaller than a width of the first test pad and a width of the second test pad in the horizontal direction.

16. The semiconductor package of claim 15, further comprising:
a first dummy pad above and connected to the first test pad, the first dummy pad including copper; and
a second dummy pad above and connected to the second test pad, the second dummy pad including copper,
wherein an upper surface of the first dummy pad is at a same plane as an upper surface of the first front side bonding pad, and
wherein an upper surface of the second dummy pad is at a same plane as an upper surface of the second front side bonding pad.

17. The semiconductor package of claim 14, further comprising:
a through via penetrating the second semiconductor substrate; and
a back side bonding pad on a lower surface of the second semiconductor substrate, the back side bonding pad connecting the through via and the second front side bonding pad.

18. The semiconductor package of claim 14, further comprising:
a recess inside the first front side bonding pad,
wherein a part of a lower surface of the second front side bonding pad is inside the recess.

19. A semiconductor package comprising:
a buffer substrate;
a first liner layer, an interlayer insulating layer, and a second liner layer sequentially stacked on an upper surface of the buffer substrate;
a first front side bonding pad above the buffer substrate, at least a part of a side wall of the first front side bonding pad surrounded by the second liner layer, the first front side bonding pad including copper;
a second front side bonding pad between and connected to the first front side bonding pad and the buffer substrate, a side wall of the second front side bonding pad surrounded by the first liner layer and the interlayer insulating layer, the second front side bonding pad including copper having a nanotwin crystal structure different from a crystal structure of the copper included in the first front side bonding pad;
a connecting pad above and connected to the first front side bonding pad;
a wiring structure above and connected to the connecting pad;
a semiconductor element layer above the wiring structure; and
a semiconductor substrate above the semiconductor element layer,
wherein a width of the first front side bonding pad in a horizontal direction is larger than a width of the second front side bonding pad in the horizontal direction.

20. The semiconductor package of claim 19, further comprising:
a test pad between the wiring structure and the upper surface of the buffer substrate, the test pad connected to the wiring structure and spaced apart from the connecting pad in the horizontal direction; and
a dummy pad between the interlayer insulating layer and the test pad, the dummy pad connected to the test pad and including copper, wherein a surface of the dummy pad facing the upper surface of the buffer substrate is completely covered by the interlayer insulating layer.

* * * * *